United States Patent [19]

Lin et al.

[11] Patent Number: 5,828,828
[45] Date of Patent: Oct. 27, 1998

[54] METHOD FOR INSERTING TEST POINTS FOR FULL-AND-PARTIAL-SCAN BUILT-IN SELF-TESTING

[75] Inventors: Chih-Jen Lin, Lawrenceville, N.J.; Kwang-Ting Cheng, Santa Barbara, Calif.

[73] Assignee: Lucent Technologies Inc., Murray Hill, N.J.

[21] Appl. No.: 939,498

[22] Filed: Sep. 29, 1997

Related U.S. Application Data

[63] Continuation of Ser. No. 606,326, Feb. 23, 1996, abandoned, which is a continuation of Ser. No. 545,323, Oct. 19, 1995, abandoned.

[51] Int. Cl.[6] .................................................. G06F 11/00
[52] U.S. Cl. ............................................... 395/183.06
[58] Field of Search .................................. 364/488, 489, 364/490, 491; 395/183.06; 371/22.4, 22.5, 22.6, 22.31, 22.32, 22.33, 22.34, 22.35, 22.36

[56] References Cited

U.S. PATENT DOCUMENTS

| | | | |
|---|---|---|---|
| 5,043,986 | 8/1991 | Agrawal et al. ...................... | 371/25.1 |
| 5,168,455 | 12/1992 | Hooper .................................. | 364/490 |
| 5,237,514 | 8/1993 | Curtin .................................. | 364/490 |
| 5,329,533 | 7/1994 | Lin ........................................ | 371/22.3 |
| 5,333,032 | 7/1994 | Matsumoto et al. ................... | 364/489 |
| 5,396,435 | 3/1995 | Ginetti ................................. | 364/489 |
| 5,404,311 | 4/1995 | Isoda .................................... | 364/490 |
| 5,426,591 | 6/1995 | Ginetti et al. ......................... | 364/489 |
| 5,450,414 | 9/1995 | Lin ........................................ | 371/22.3 |
| 5,636,372 | 6/1997 | Hathaway et al. .................... | 395/555 |

*Primary Examiner*—Robert W. Beausoliel, Jr.
*Assistant Examiner*—Stephen C. Elmore
*Attorney, Agent, or Firm*—Steven R. Bartholomew; Robert B. Levy

[57] ABSTRACT

Test points (20, 24) placed at selected nodes (16) within a circuit (10) based on a cost function that accounts for (a) the global improvement in testability and (b) the penalty in circuit performance associated with propagation delays attributable to such test points. By accounting for both the global impact on testability and circuit performance degradation, the cost function maximizes fault coverage while achieving nearly minimal impairment of circuit performance.

3 Claims, 3 Drawing Sheets

FIG. 6
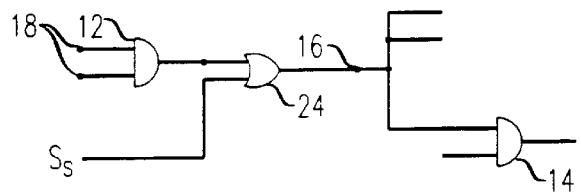
FIG. 7
a ─┐
   ├)── x    $C_x = C_a \cdot C_b$
b ─┘         $O_a = O_x \cdot C_b$
FIG. 8
a ─┐
   ├)── x    $C_x = 1 - (1-C_a) \cdot (1-C_b)$
b ─┘         $O_a = O_x \cdot (1-C_b)$
FIG. 9
a ──▷∘── b    $C_b = 1 - C_a$
              $O_a = O_b$
FIG. 10
         ┌── x    $C_x = C_y = C_a$
 ────────┤
         └── y    $O_a = 1 - (1-O_x) \cdot (1-O_y)$
FIG. 11a
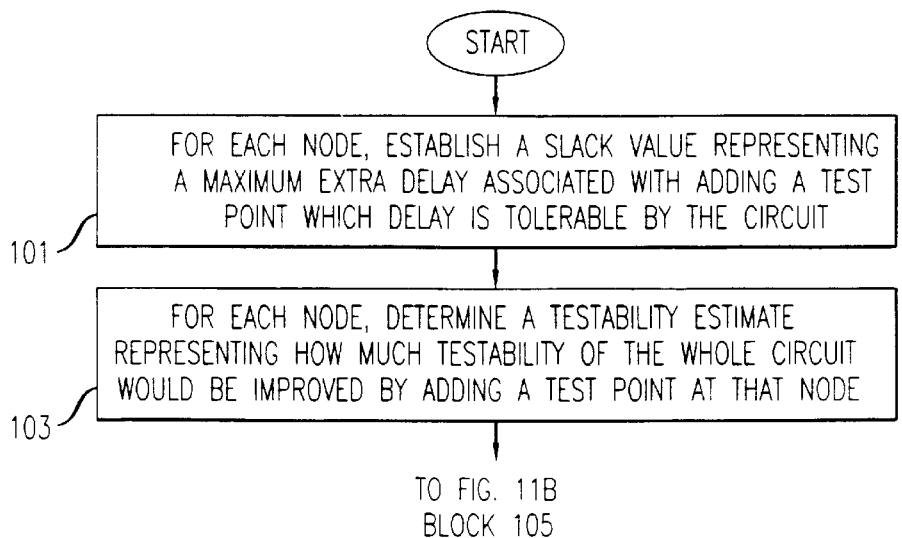

METHOD FOR INSERTING TEST POINTS FOR FULL-AND-PARTIAL-SCAN BUILT-IN SELF-TESTING

This application is a continuation of application Ser. No. 08/606,326, filed on Feb. 23, 1996, now abandoned which is a File-Wrapper Continuation of U.S. patent application Ser. No. 08/545,323, filed on Oct. 19, 1995, now abandoned.

TECHNICAL FIELD

This invention relates to a technique for modifying a circuit by adding at least one additional test point therein to facilitate Full- or Partial-Scan testing.

BACKGROUND ART

As a result of advances in miniaturization, integrated circuits now contain an ever increasing number of circuit elements. As the number of circuit elements in each circuit has increased, so has the difficulty and expense of testing. Several Design For Testability (DFT) techniques presently exist to facilitate testing of very dense circuits. One DFT technique is Level-Sensitive Scan-Design that facilitates testing by requiring that crucial flip-flops be replaced by scan flip-flops that are connected in a single scan loop. A test pattern generator applies successive test vectors to the scan chain, which, in turn generates responses that are analyzed to detect faults within the circuit. More recently, Partial-Scan testing has been proposed as an alternative to reduce the overhead associated with Level-Sensitive Scan-Design testing. As described in U.S. Pat. No. 5,043,986, issued on Aug. 27, 1991, in the name of V. Agrawal et al., and assigned to AT&T Bell Laboratories, (incorporated by reference herein), Partial-Scan testing is practiced by partitioning a circuit so selected sequential elements (i.e., flip-flops) within the circuit are arranged as a shift register. Initially, while the circuit operates in a test mode, a test vector is shifted into the shift register comprised of the selected sequential elements. Thereafter, the circuit returns to its conventional operating mode to react to the test data. Finally, the integrated circuit reverts to the test data to permit shifting out of the test vector, as modified during normal operation of the circuit.

The above-described Partial-Scan testing technique may be improved in the manner taught in my U.S. Pat. No. 5,329,533, issued on Jul. 12, 1995, and assigned to AT&T Bell Laboratories (incorporated by reference herein). In my '533 patent, a circuit configured for Partial-Scan testing can be rendered circuit self-testing by the addition of a test pattern generator and compactor. In addition, fault coverage can be increased by replacing self-looping non-scan flip-flops with intializable flip-flops so the integrated circuit can be set to an initial state prior to testing.

In my U.S. Pat. No. 5,450,414, issued Sep. 12, 1995 and assigned to AT&T Bell Laboratories (incorporated by reference herein), a technique is disclosed for enhancing Partial-Scan testing of a near-acyclic circuit by adding at least one test point to the circuit to increase both the observability and the controllability of selected circuit nodes. Increasing the controllability and the observability of selected nodes increases the level of fault coverage that may be obtained. While the test point insertion technique described in my '414 patent increases the level of fault coverage, it is possible that some performance degradation may occur if the test points are inserted in critical paths. When a test point is inserted on a critical path, then the propagation time increases, thus adversely affecting the circuit performance.

Thus, there is a need for a technique for inserting test points in a circuit to increase fault coverage during testing while minimizing the degradation on the circuit performance.

BRIEF SUMMARY OF THE INVENTION

Briefly, the present invention concerns a method for adding at least one test point to a signal-receiving circuit to improve the testability of the circuit. In accordance with the invention, test point insertion is accomplished by first analyzing the circuit to determine the amount of signal slack associated with each node of the circuit. The signal slack is defined as the difference between the amount of time required for a signal to arrive at an associated node and the actual time for that signal to arrive. For each node, a testability estimate is established to provide a measure of the improvement in testability that would be achieved by adding a test point at the node. In practice, the testability estimate is established in accordance with a cost reduction factor that measures the reduction in U, a factor that represents the average expected length of testing.

Once the signal slack and the testability estimate for each node have been established, then each node is examined in sequence to determine if the signal slack for that node is below a signal slack threshold. Also each node is examined to determine whether its testability estimate is the best for all of the nodes that have a signal slack below the threshold. For each node satisfying both of the above conditions, a test point is added at that node. After inserting the test point, the fault coverage for the circuit is now computed. If the circuit still contains less than a maximum allowed number of test points and the fault coverage is less than a desired fault coverage, the process of examining each node, and inserting a test point when the above-described conditions are satisfied is repeated. Once the maximum number of test points have been inserted, or the fault coverage at least equals the desired fault coverage, then the test point insertion process ends.

As may be appreciated, the test point insertion method of the invention accounts for the cost of test point insertion in terms of the degradation to the performance of the circuit. Thus, the present method increases the circuit testability while minimizing the impact of test point insertion.

BRIEF DESCRIPTION OF THE DRAWINGS

FIG. 6 shows the same portion of the circuit in FIG. 2 with the addition of the control point;

FIG. 7 shows an AND gate, together with formulas for computing the observability and controllability of the gate output;

FIG. 8 shows an OR gate, together with formulas for computing the observability and controllability of the gate output;

FIG. 9 shows a NOT gate, together with formulas for computing the observability and controllability of the gate output; and FIG. 10 shows a circuit branch, together with formulas for computing the observability and controllability at the output of each branch.

FIGS. 11A and 11B together comprise a flowchart setting forth an improved method for inserting test points according to a preferred embodiment disclosed herein.

DETAILED DESCRIPTION

Figure 1:
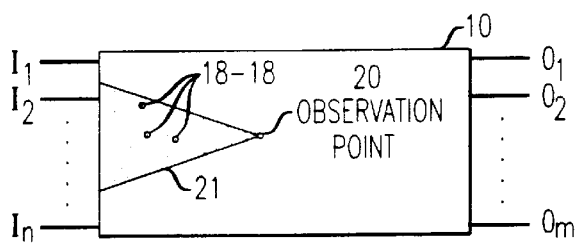
FIG. 1 shows a prior art circuit to which an observation point has been added.
Figure 2:
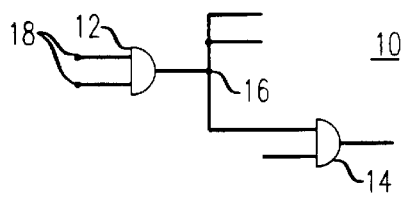
FIG. 2 shows a portion of the circuit of FIG. 1 prior to the insertion of an observation point.

Before proceeding to discuss the invention, some background information may prove helpful. Referring to FIG. 1, there is shown a conventional circuit 10 having a plurality of inputs $I_1$–$I_n$ and a plurality of outputs $O_1$–$O_m$, where n and m are integers. Referring to FIG. 2, the circuit 10 includes a first AND gate 12 having its output linked to an input of a second AND gate 14 at a node 16. The circuit 10 of FIG. 12 may include many other elements, such as gates or flip-flops (not shown) in addition to the gates 12 and 14.

Figure 3:
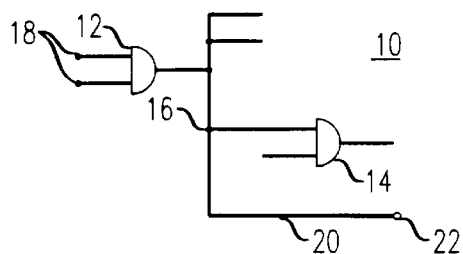
FIG. 3 shows the same portion of the circuit in FIG. 2, except with the addition of the observation point.

Referring to FIG. 2, the signal present at the node 16 will reflect the state of the input signals at the inputs of the AND gate 12. For ease of discussion, the AND gate 12 inputs are designated as nodes 18 and 18 which may receive signals either directly or indirectly from one or more of the inputs $I_1$–$I_n$. For the purposes of testing the circuit 10, it may be desirable to monitor, at the node 16, the state of the signals at the nodes 18 and 18 (as well as the nodes that are upstream therefrom). However, as seen in FIG. 2, in the absence of any direct link to the node 16, no ability exists to directly observe the signals at this node. To allow observation of the signals at the node 16, it may be desirable to provide the circuit 10 with a test point in the form of an observation point 20, which, as seen in FIG. 3 physically comprises an electrical conductor, either in the form of a wire or metallized path or link, connected between the node 16 and separate terminal 22. As best illustrated in FIG. 1, the observation point 20 permits observation, at the node 16, of the status of signals at those nodes, including the nodes 18—18, lying within the stippled region within the cone 21.

Figure 4:
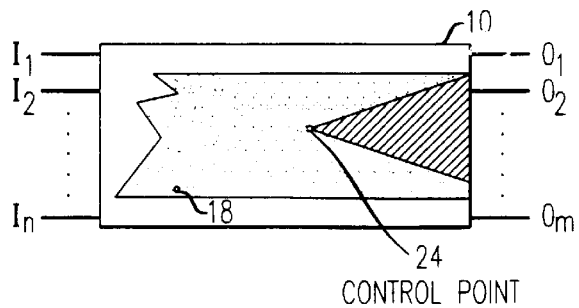
FIG. 4 shows the prior art circuit of FIG. 1 having a control point.

Referring to FIG. 4, it may be desirable to configure the circuit 10 to include at least one test point in the form of a control point 24 rather than the observation point 20 of FIG. 1. Each control point 24 represents a node, such as the node 16 of FIG. 5, at which signals both upstream and downstream of that node (such as at the nodes 18—18 at the inputs of the AND gate 12) can be influenced (i.e., controlled). Thus, referring to FIG. 4, the signals at those nodes (including node 18) that lie within the shaded regions, can be controlled at the control point 24.

Figure 5:
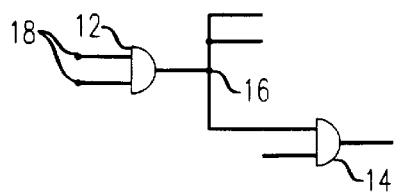
FIG. 5 shows the same portion of the circuit in FIG. 2 prior to the insertion of the control point.

To understand the nature of the control point 20 of FIG. 4, reference should be had to FIG. 5 that illustrates the gates 12 and 14 within the circuit 10 of FIG. 1 prior to the insertion of the control point 20. As may be appreciated from FIG. 5, prior to the addition of the control point 20 of FIG. 1, the signal appearing at node 16 is only influenced by the state of the signals present at the nodes 18—18 of the gate 12. During testing, it may be desirable to control the state of the signal at the node 16 independently of the signals at the nodes 18—18. To that end, the circuit 10 may be provided with the control point 20 of FIG. 6 comprised of a two-input OR gate interposed between the gate 12 and the node 16. Thus, as seen in FIG. 6, the OR gate comprising the control point 20 has a first input coupled to the output of the AND gate 12, and an output coupled to the node 16. The OR gate comprising the control point 20 has a second input supplied with a control signal S, whose state will influence the state of the signal at the node 16, and those nodes downstream therefrom. Thus, while the control signal S, remains active high (at a logic "1"level), the signal at the node 16 also remains at the same level. While the control point 24 is depicted as an OR gate, under some circumstances it may be desirable to configure the control point as an AND gate. For a further discussion of which type of gate should be employed, reference should be had to my U.S. Pat. No. 5,450,414 (incorporated by reference herein).

Inserting a test point, either in the form of the observation point 20 or the control point 24, into the circuit 10 may degrade the performance of the circuit, especially if inserted into a critical path. The presence of such a test point may delay signal propagation, especially if the test point comprises the control point 24. The method of the invention, as discussed in greater detail below, minimizes circuit performance degradation by providing a scheme for selecting nodes for test point insertion to maximize the circuit testability while minimizing the performance degradation. To understand the manner in which the method of the invention accomplishes these goals, some background information may prove helpful on how adding test points aids in testability.

Adding the observation point 20 to the circuit 10 of FIG. 1 increases the ability to observe a fault that propagates to the node 16 of FIG. 3 from one of the inputs $I_1$–$I_n$. Adding the control point 24 to the circuit 10 of FIG. 4 increases the ability to control (i.e., effect) a signal at one of the outputs $O_1$–$O_m$. The degree to which the observation point 20 renders the node 16 of FIG. 3 observable is defined in terms of the probability that a fault present at one of the inputs $I_1$–$I_n$ is observable at the observation point. Likewise, the degree to which the control point 24 controls the node 16 is defined as the probability of effecting a certain signal value at that node. FIG. 7 depicts the formulae for computing a controllability value $C_x$ and an observability value $O_x$, respectively, at the output x of a two-input AND gate in accordance with the controllability $C_a$ and $C_b$ and observabilities $O_a$ and $O_b$ at the gate inputs a and b, respectively. FIG. 8 depicts the formulae for computing the controllability value $C_x$ and the observability value $O_x$ at the output x of a two-input OR gate in accordance with the controllability $C_a$ and $C_b$ and observabilities $O_a$ and $O_b$ at the gate inputs a and b, respectively. FIG. 9 depicts the formulae for computing the controllability value $C_b$ and the observability value $O_b$, at the output b of a NOT gate in accordance with the controllability $C_a$ and an observability $O_a$ at the NOT gate input a. Lastly, FIG. 10 depicts formulae for computing the controllability values $C_x$ and $C_y$ and observability values $O_x$ and $O_y$, at each of a pair of circuit branches x and y supplied directly from an input a having a controllability $C_a$ and an observability $O_b$.

While the individual controllability and observability values at each circuit node are useful measures, the values, by themselves, are not good guides for achieving optimal test point selection. In practice, the controllability and observability of each node only provides a local measure of testability, rather than any indication of the global impact associated with adding a test point. A good measure of the cost U associated with testability is given by the relationship:

$$U = \frac{1}{|F|} \left( \sum_{i \in F} \frac{1}{pd_i} \right) \quad (1)$$

where F represents the fault set and |F| represents the cardinality of F and $pd_i = C_s \cdot O_s$ if i represents the stuck-at-0 faults at s and
$pd_i = (1 - C_s) \cdot O_s$ if i represents the stuck-at-1 fault at s.

Equation 1 can be viewed as a measure of the average expected test length of all faults in the circuit 10 because for any fault i, $1/pd_i$ is the expected test length of the fault To better establish the cost function U, it is useful to define a controllability gradient value $G_{C_s}$ and a observability gradient value $G_{O_s}$ representing the change in the rate of the cost function U with respect to $C_s$ and $O_s$, respectively. The controllability gradient value $G_{C_s}$ and the observability gradient value $G_{O_s}$ can be established from the relationships:

$$G_{C_s} = \frac{dU}{dC_s} \quad (2)$$

and $$G_{O_s} = \frac{dU}{dO_s} \quad (3)$$

The controllability gradient value $G_{C_s}$ and the observability gradient value $G_{O_s}$ given by eqs. (1) and (2), respectively, are still not good indicators of the impact on global testability associated with adding a test point. Therefore, it is useful to define a Cost Reduction Factor (CRF) which better reflects the reduction in U associated with the insertion of a test point. The Cost Reduction Factor ($CRF_x^{OR}$) associated with inserting a test point at the x output of the OR gate of FIG. 8 is given by the relationship:

$$CRF_x^{OR} = \frac{C_x - 1}{C_x + 1} \cdot C_a \cdot \frac{dU}{dC_x} - \frac{2}{C_x \cdot (1 - C_x) \cdot O_s} \quad (4)$$

The Cost Reduction Factor ($CRF_x^{AND}$) associated with inserting a test point at the x output of the AND gate of FIG. 7 is given by the relationship:

$$CRF_x^{AND} = \frac{1 - C_x}{2 - C_x} \cdot C_x \cdot \frac{dU}{dC_x} - \frac{2}{C_x \cdot (1 - C_x) \cdot O_x} \quad (5)$$

For a fanout stem shown in FIG. 10, the Cost Reduction Factor ($CRF_s^{OBS}$) will be given by the relationship:

$$CRF_s^{OBS} = (O_s - 1) \cdot O_s \cdot \frac{dU}{dO_s} \quad (6)$$

Otherwise, the Cost Reduction Factor ($CRF_s^{OBS}$) will be given by the relationship:

$$CRF_s^{OBS} = (O_s - 1) \cdot O_s \cdot \frac{dU}{dO_s} - \left( \frac{1}{C_s} + \frac{1}{1 - C_s} \right) \quad (7)$$

Thus, depending on the type of circuit or circuits whose output(s) form the node of interest, the CRF at that node can be computed from eqs. (4)–(7).

However, simply placing a test point at a node on the basis of the Cost Reduction Factor alone may not be beneficial. As discussed earlier, placing a test point on a critical path may adversely impact circuit performance. Thus, it is not sufficient to ignore issues of circuit performance.

To account for potential circuit degradation, test point insertion in accordance with the invention is carried out by examining each node to determine both the performance degradation caused by inserting a test point as well as the improvement in testability. To measure the the performance degradation associated with adding a test point, one has to consider two parameters, (i) the extra delay incurred by adding the test point, and (ii) the "slack" at the node. The slack at the node is defined as the difference between the the desired arrival time and the actual arrival time of a signal at the node. In the context of adding a test point, the slack of a node represents the maximum extra delay that a test point can incur at the node without impacting the performance of the circuit. Depending on the circuit, some amount of propagation delay may be tolerable. In other words, as long as the extra delay incurred by adding a test point is less than a slack threshold (representing the maximum allowable slack), circuit performance will not be adversely affected. Well-known techniques are readily available for establishing the circuit slack. Therefore, a discussion as to the exact nature of how the signal slack is actually computed has been omitted.

To accomplish test point insertion in accordance with the invention, the signal slack for each node is first calculated. For each node, a testability measure is computed. In practice, the testability at each node is determined in accordance with the Cost Reduction Factor computed from equations (4)–(7). For each node, a determination is made whether the testability measure (i.e., the Cost Reduction Factor) is the best for all of the nodes computed thus far. Also, for each node, a check is made whether the extra delay is less than a threshold (maximum allowable) value. If the testability measure is the best among the nodes, and the extra delay associated with adding the test point lies below the threshold slack value, a test point is inserted. Thereafter, the fault coverage obtained following test point insertion is computed. The above-process of examining each successive node (and inserting a test point when the prescribed conditions are met) is repeated so long as both the number of test points does not exceed a maximum allowable number, and the fault coverage does not exceed a desired coverage level. Once either the maximum number of test points has been inserted, or the desired fault coverage is reached, the process ends.

The above-described method may be readily implemented in a the "C:" computer language as set forth in Table I:

```
{
while FC < desired_fc and number_of_test_point <
Maximum number {
    Compute slacks for all the nodes in the circuit
    For each node s
        Compute the Controllability C_s and observability O_s
        Compute the gradients G_Cs and G_Os
        Compute the gradients CRF_s^OBS
        Compute the CRF_s^AND or CRF_s^OR, depending on the sign
          of the gradients G_Cs and G_Os.
        Determine the maximum value of CRF, called CR_Fmax,
          amoung all the CRFs computed.
        Determine the set of candidate test point N_T, where
          N_T = {i|CRF^and/or/obs > threshold CRF_max and
          Delay_i < Slack_threshold}
        For each i in N_T, insert the test point, then compute the U_i.
        Select test point j if U_j > U_i, for any i belong to N_T and i ≠ j
        Insert the test point j.
    }
}
```

The above-described method can be readily implemented in a full-scan circuit. Further, the method can also be implemented with near-acyclic circuits of the type discussed in my previous U.S. Pat. No. 5,450,414. However, a somewhat different type of testability measure must be used. For a near-acyclic circuit, the Stationary State Controllability Observability Measure (SSCOM) may be used. The SSCOM is described in my previous U.S. Pat. 5,450,414 and may be obtained by decomposing the near acyclic circuit into blocks that are then levelized by macro levels.

For any blocks resulting from decomposition that contains a feedback line, the testability measures described previously must be modified to account for the feedback loop. In practice a symbolic technique can be used. For a self-looping block, the controllability are computed at its inputs. A symbolic value, say x, is assigned to the loop feedback port. Conventional techniques, as well known in the art, can be used to compute the controllability and observability of the internal nodes within the block. The resultant controllability and observability values will be polynomials, but the higher order terms can usually be suppressed. As a result, the controllability and testability values can be established as linear functions of x. By the same token, the observability values can also be expressed as a linear function of x.

Once the controllability and observability values for the near-acyclic circuit have been obtained in the manner discussed above, the observability gradient dU/dO is computed on a block-by-block basis, commencing from the lower level towards the higher level macro blocks. Such a computation begins by initializing the value of dU/dO at the primary input nodes based on the nodes controllability and observability values. Before the computation of a block, the dU/dO values at the inputs of the block (except the feedback port) will have been computed. The dU/dO values for all other notes are computed recursively applying the chain rule. The dU/dO value at a primary input I may be given by:

$$\frac{dU}{dO_i} = \frac{-C_i}{PD_{i-0}^2} + \frac{(C_i - 1)}{(Pd_{i-1}^2)} \quad (8)$$

where $C_i$ is the controllability of the primary input I; and $P^2_{i-0}$ and $P^2_{i-1}$ are the detection probability of a stuck-at-zero and a stuck-at one fault at the signal i.

Using the chain rule, derivative can be propagated from gate inputs to gate outputs using the formula:

$$\frac{dU}{dO_k} = \frac{-C_k}{Pd_{k-0}^2} + \frac{(C_k - 1)}{Pd_{k-1}^2} + \sum_i^{inputs} \frac{dU}{dO_i} \frac{dO_i}{dO_k} \quad (9)$$

The first two terms of eq. (9) represent the change in the output node k itself whereas the summation represents the effect of all of the gate inputs.

For a self-looping block in the near acyclic circuit, the gradient dU/dO is assigned a symbolic variable x in the manner discussed above. In practice, the first two terms of eq. (9) are constant because the controllability and observability are known. If the value of $dU/dO_k$ at the input of a self-looping block can be expressed as a linear function of x, the value of $dU/dO_k$ can be easily derived. Once the observability gradients have been computed, the controllability gradients can then be computed. The controllability gradient dU/dC can be computed in much the same fashion as the observability gradient by assigning the controllability at the feedback port of the self-looping block the symbolic variable x and then solving for the value in the manner discussed. Once the controllability and observabilities, as well as the controllability and observability gradients have been computed, then the Cost Reduction Factor can be established using equations (4)–(7).

The foregoing describes a technique for inserting a test point, either in the form of a observation point 20 or a control 24, into a circuit 10 to irease the testability of the circuit while minimizing the any degradation associated with adding the test point.

Figure 11B:
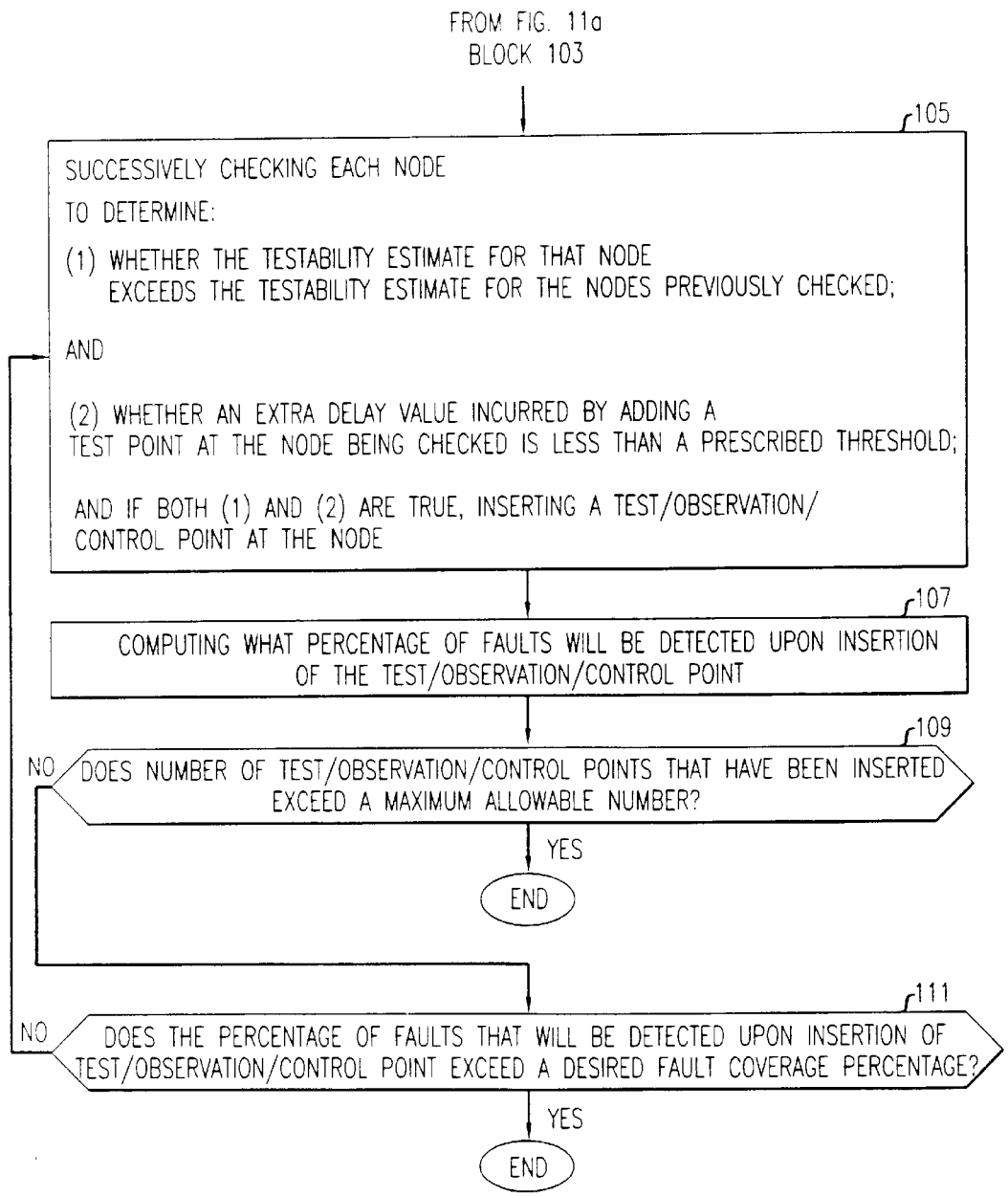

FIGs. 11A, and 11B together comprise a flowchart setting forth an improved method for inserting test points according to a preferred embodiment disclosed herein. With reference to FIG. 11A, the method commences at block 101 where, for each node, a slack value is established that represents a maximum extra delay associated with adding a test point. The circuit under test should be capable of tolerating this delay. Next, at block 103, for each node, a testability estimate is determined, This estimate represents how much the testability of the whole circuit would be improved by adding a test point at that node.

Program control progresses to block 105 of FIG. 11B where each node is successively checked to determine (1) whether the testability estimate for that node exceeds the testability estimate for the nodes previously checked, and (2) whether an extra delay value incurred by adding a test point at the node being checked is less than a prescribed threshold. If both (1) and (2) are true, a test/observation/control point is inserted at the node. The program advances to block 107 where the percentage of faults that will be detected upon insertion of the test/observation/control point is computed. At block 109, a test is performed to ascertain whether or not the number of test/observation/control points have been inserted exceeds a maximum allowable number. If so, the program exits and, if not, the program advances to block 111 of FIG. 11B. At block 111, a test is performed to determine whether the percentage of faults that will be detected upon insertion of the test/observation/control point exceeds a desired fault coverage percentage. If so, the program exits. The negative branch from block 111 leads back to block 105 of FIG. 11A.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for adding at least one test point at one of a plurality of signal receiving nodes within a circuit, comprising the steps of:

(a) establishing, for each node, a slack value representing a maximum extra delay associated with adding a test point that is tolerable by the circuit;

(b) determining, for each node, a testability estimate representing how much testability of the whole circuit would be improved by adding a test point at the node;

(c) successively checking each node to determine (i) whether the testability estimate for that node exceeds the testability estimate for the nodes previously checked and (ii) whether an extra delay value incurred by adding a test point at the node being checked is less than a prescribed threshold, and if both (i) and (ii) are true, then inserting a test point at the node;

(d) computing what percentage of faults will be detected upon insertion of the test point; and (e) repeating steps (c)–(d) as long as the test points that have been inserted do not exceed in number of maximum allowable number of test points and the percentage faults that will be detected upon test point insertion does not exceed a desired fault coverage percentage;

CHARACTERIZED IN THAT the testability estimate is a function of the average expected test length for faults in the circuit;

the average expected test length is a function of the observability and controllability of the nodes within the circuit;

the step of inserting a test point includes inserting an observation point; and the step of inserting a test point includes the step of inserting a control point.

2. A method for adding at least one test point at one of a plurality of signal receiving nodes within a Full-Scan circuit, comprising the steps of:

(a) establishing, for each node, a slack value representing a maximum extra delay associated with adding a test point that is tolerable by the Full-Scan circuit;

(b) determining, for each node, a testability estimate representing how much testability of the whole circuit would be improved by adding a test point at the node;

(c) successively checking each node to determine (i) whether the testability estimate for that node exceeds the testability estimate for the nodes previously checked and (ii) whether an extra delay value incurred by adding a test point at the node being checked is less than a prescribed threshold, and if both (i) and (ii) are true, then inserting a test point at the node;

(d) computing what percentage of faults will be detected upon insertion of the test point; and (e) repeating steps (c)–(d) as along at the test points that have been inserted do not exceed in number a maximum allowable number of test points and the percentage faults that will be detected upon test point insertion does not exceed a desired fault coverage percentage;

CHARACTERIZED IN THAT the testability estimate is a function of the average expected test length for faults in the circuit;

the average expected test length is a function of the observability and controllability of the nodes within the circuit;

the step of inserting a test point includes inserting an observation point; and the step of inserting a test point includes the step of inserting a control point.

3. A method for adding at least one test point at one of a plurality of signal receiving nodes within a Partial-Scan circuit, comprising the steps of:

(a) establishing, for each node, a signal value representing a maximum extra delay associated with associated with adding a test point that is tolerable by the Partial-Scan circuit;

(b) determining, for each node, a testability estimate representing how much testability of the whole circuit would be improved by adding a test point at the node;

(c) successively checking each node to determine (i) whether the testability estimate for the node exceeds the testability estimate for the nodes previously checked and (ii) whether an extra delay value incurred by adding a test point at the node being checked is less that a prescribed threshold, and if both (i) and (ii) are true, then inserting a test point at the node;

(d) computing what percentage of faults will be detected upon insertion of the test point; and (e) repeating steps (c)–(d) as long as the test points have been inserted do not exceed in number a maximum allowable number of test points and the percentage faults will be detected upon test point insertion does not exceed a desired fault coverage percentage;

CHARACTERIZED IN THAT the testability estimate is a function of the average expected test length for faults in the circuit;

the average expected test length is a function of the observability and controllability of the nodes within the circuit;

the step of inserting a test point includes inserting an observation point; and the step of inserting a test point includes the step of inserting a control point.

* * * * *